(12) United States Patent
Mikawa et al.

(10) Patent No.: US 8,574,957 B2
(45) Date of Patent: *Nov. 5, 2013

(54) METHOD FOR MANUFACTURING NONVOLATILE SEMICONDUCTOR MEMORY ELEMENT

(75) Inventors: Takumi Mikawa, Shiga (JP); Yukio Hayakawa, Kyoto (JP); Takeki Ninomiya, Osaka (JP); Yoshio Kawashima, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/502,769

(22) PCT Filed: Nov. 10, 2011

(86) PCT No.: PCT/JP2011/006302
§ 371 (c)(1),
(2), (4) Date: Apr. 19, 2012

(87) PCT Pub. No.: WO2012/063495
PCT Pub. Date: May 18, 2012

(65) Prior Publication Data
US 2012/0238055 A1    Sep. 20, 2012

(30) Foreign Application Priority Data

Nov. 12, 2010 (JP) ................................. 2010-254314

(51) Int. Cl.
*H01L 21/00* (2006.01)
(52) U.S. Cl.
USPC .......................................................... 438/104
(58) Field of Classification Search
USPC .................. 438/102–104, 257; 257/E21.662
See application file for complete search history.

(56) References Cited

U.S. PATENT DOCUMENTS

| 7,173,271 | B2 | 2/2007 | Chang |
| 7,244,979 | B2 | 7/2007 | Iwasaki et al. |
| 7,692,178 | B2 | 4/2010 | Kawashima et al. |
| 7,919,774 | B2 | 4/2011 | Kawashima et al. |
| 8,022,502 | B2 | 9/2011 | Kanzawa et al. |
| 8,049,204 | B2 | 11/2011 | Ito |
| 2006/0006374 | A1 | 1/2006 | Chang |

(Continued)

FOREIGN PATENT DOCUMENTS

| JP | 2006-019688 | 1/2006 |
| JP | 2006-186260 | 7/2006 |

(Continued)

OTHER PUBLICATIONS

International Search Report issued Dec. 6, 2011 in International (PCT) Application No. PCT/JP2011/006302.

*Primary Examiner* — Quoc Hoang
(74) *Attorney, Agent, or Firm* — Wenderoth, Lind & Ponack, L.L.P.

(57) ABSTRACT

An object of the present invention is to provide a method for manufacturing a variable resistance nonvolatile semiconductor memory element which can operate at a low voltage and high speed when initial breakdown is caused, and inhibit oxidization of a contact plug. The method for manufacturing the variable resistance nonvolatile semiconductor memory element, which includes a bottom electrode, a variable resistance layer, and a top electrode which are formed above a contact plug, includes oxidizing to insulate an end portion of the variable resistance layer prior to forming a bottom electrode by patterning a first conductive film.

8 Claims, 9 Drawing Sheets

(56) References Cited

U.S. PATENT DOCUMENTS

| | | |
|---|---|---|
| 2006/0138506 A1 | 6/2006 | Iwasaki et al. |
| 2009/0014710 A1 | 1/2009 | Kawashima et al. |
| 2009/0101885 A1 | 4/2009 | Seko et al. |
| 2009/0283736 A1 | 11/2009 | Kanzawa et al. |
| 2010/0078615 A1 | 4/2010 | Ito |
| 2010/0200852 A1 | 8/2010 | Kawashima et al. |
| 2011/0062405 A1 | 3/2011 | Tsukamoto et al. |
| 2011/0103131 A1 | 5/2011 | Katayama et al. |
| 2011/0294259 A1 | 12/2011 | Kanzawa et al. |
| 2013/0015423 A1* | 1/2013 | Mikawa et al. ............ 257/4 |

FOREIGN PATENT DOCUMENTS

| | | |
|---|---|---|
| JP | 2009-099854 | 5/2009 |
| JP | 2010-251352 | 11/2010 |
| WO | 2007/102483 | 9/2007 |
| WO | 2008/102718 | 8/2008 |
| WO | 2008/149484 | 12/2008 |
| WO | 2009/128142 | 10/2009 |
| WO | 2010/125780 | 11/2010 |

* cited by examiner

METHOD FOR MANUFACTURING NONVOLATILE SEMICONDUCTOR MEMORY ELEMENT

TECHNICAL FIELD

The present invention relates to a method for manufacturing a variable resistance nonvolatile semiconductor memory element a resistance value of which changes by application of a voltage pulse.

BACKGROUND ART

In recent years, with advance in digital technology, electronic devices such as mobile information devices and information home appliances have been developed to provide higher functionality. As the electronic devices provide higher functionality, miniaturization and an increase in speed of semiconductor devices for use with the electronic devices are making rapid progress. Among them, the use of a large capacity nonvolatile memory, represented by flash memory, is rapidly expanding. Furthermore, as a next-generation new nonvolatile memory replacing the flash memory, there is on-going research and development of variable resistance nonvolatile semiconductor memory elements using what is called a variable resistance element. Here, the variable resistance element refers to an element which has a characteristic in which a resistance value reversibly changes depending on electric signals, and further is able to store information corresponding to the resistance value in a nonvolatile fashion.

As an example of the variable resistance element, nonvolatile semiconductor memory elements incorporating a variable resistance element in which a stack of transition metal oxides having different oxygen content percentages is used for a variable resistance layer are proposed. For example, PTL 1 discloses that the redox reaction is selectively generated at an electrode interface in contact with the variable resistance layer having a high oxygen content percentage to stabilize the resistance change.

CITATION LIST

Patent Literature

[PTL 1] WO2008/149484

SUMMARY OF INVENTION

Technical Problem

In the above nonvolatile semiconductor memory element, to change to a state in which the resistance change stably occurs, breakdown (initial breakdown) is caused in which a voltage is first applied to the variable resistance element and a portion of the variable resistance layer having a high oxygen content percentage is locally short-circuited. What is important here is applying a sufficient voltage to the variable resistance element without unnecessary voltages transferring to a transistor and parasitic resistance components other than the variable resistance element. The proposal by the inventors is to reduce a size of an active area and a leakage current by oxidizing and insulating a sidewall portion of the variable resistance element.

Parts (a) through (i) of FIG. 9 show cross-sectional views illustrating a method for manufacturing main part of a nonvolatile semiconductor memory element proposed by the inventors.

First, as shown in (a) of FIG. 9, above a substrate 100 above which a transistor, an underlying line, and the like are formed, a conductive layer comprising aluminum (Al) or the like is formed and patterned to form an underlying line 101. Furthermore, an insulating film is formed above the substrate 100, covering the underlying line 101, and thereafter a surface of the insulating film is planarized to form an interlayer insulating layer 102. Then, the interlayer insulating layer 102 is patterned using a desired mask to form a contact hole 103 extending through the interlayer insulating layer 102 to the underlying line 101.

Next, as shown in (b) of FIG. 9, first, the contact hole 103 is filled with a filler material comprising tungsten (W) as a principal component, planarization polishing is performed on an entire wafer surface, using the chemical mechanical polishing (CMP), to remove unnecessary portion of the filler material on the interlayer insulating layer 102 to form a contact plug 104 inside the contact hole 103.

Next, shown in (c) of FIG. 9, a first conductive film 105', which is to be a bottom electrode 105, comprising a tantalum nitride (TaN) is formed above the interlayer insulating layer 102 by a sputtering method, covering the contact plug 104.

Next, as shown in (d) of FIG. 9, the first variable resistance film 106a' and the second variable resistance film 106b' each comprising a transition metal oxide are formed above the first conductive film 105' in the stated order. The first variable resistance film 106a' has an oxygen content percentage of 50 to 65 atm %, the resistivity of 2 to 50 mΩ·cm, and a film thickness of 20 nm to 100 nm. The second variable resistance film 106b' has an oxygen content percentage of 65 to 75 atm %, the resistivity of 1E7 (namely, $1\times10^7$) mΩ·cm or greater, and a film thickness of 3 nm to 10 nm.

Next, as shown in (e) of FIG. 9, a second conductive film 107', which comprises a noble metal (such as platinum (Pt), iridium (Ir), and palladium (Pd)) and is to be a top electrode 107 after being patterned, is formed above the second variable resistance film 106b'.

Next, as shown in (f) of FIG. 9, the second conductive film 107' is patterned using the desired mask to form the top electrode 107. Subsequently, as shown in (g) of FIG. 9, the first variable resistance film 106a' and the second variable resistance film 106b' are patterned using the desired mask to form a variable resistance layer 106 having a stacked structure including a first variable resistance layer 106a and a second variable resistance layer 106b. Furthermore, as shown in (h) of FIG. 9, the first conductive film 105' is patterned using the desired mask to form the bottom electrode 105, and a variable resistance element in which the variable resistance layer 106 is interposed between the bottom electrode 105 and the top electrode 107 is formed. Typically, the steps shown in (f) through (h) of FIG. 9 use a same mask and are implemented as a series of steps. This is because concern exists that if processing of other step is performed during the patterning (etching) of the element, the yield rate may decrease or manufacturing throughput may reduce.

Last, as shown in (i) of FIG. 9, by annealing the variable resistance element in an oxygen atmosphere, an end portion of the first variable resistance layer 106a is oxidized and an insulating region 106c is formed. Here, the second variable resistance layer 106b is initially in close proximity to an insulating layer, thus hardly oxidized.

Using the manufacturing method described above, by oxidizing and insulating a sidewall portion of the variable resistance element, the size of an active area of the first variable resistance layer 106a is reduced, thereby achieving reduction of the leakage current flowing through a damaged region in the variable resistance layer 106, a decrease of the breakdown voltage, and shortening of the time for which the breakdown voltage is applied.

To achieve the manufacturing method described above, however, problem arises with respect to the miniaturization and an increase of memory capacity. FIG. 10 shows a cross-sectional SEM image of a bad bit of a nonvolatile semiconductor memory element formed by the manufacturing method described above. It can be seen that if the variable resistance element is formed misaligned with an underlying contact plug 104, a top surface of the contact plug 104 comprising tungsten as a principal component is displaced outward from a bottom electrode, ending up being oxidized by oxygen annealing illustrated in (i) of FIG. 9. When oxidized, tungsten increases its resistance value, and thus the resistance of the contact plug 104 increases causing parasitic resistance to increase. As a result, a required voltage cannot be applied to the variable resistance element. Due to this, a voltage (breakdown voltage) required for a memory cell to initialize cannot be applied thereto, and therefore breakdown is not caused in the variable resistance element, or resistance change becomes impossible due to the fact that a threshold voltage required for the resistance change is inapplicable. As a result, a bad bit is created. There is a tendency that the more the variable resistance element is miniaturized, the smaller a margin for mask alignment with the underlying contact plug 104 is. Moreover, the larger the capacity of the variable resistance element is, the more variation with respect to the position of each variable resistance element increases. Therefore, the frequency of occurrence of such phenomenon tends to worsen along with the miniaturization and an increase of capacity of the variable resistance element. Moreover, even if the contact plug 104 is fully covered with the bottom electrode 105, concern exists that the contact plug 104 is oxidized via the interlayer insulating layer 102.

An object of the present invention is to provide a method for manufacturing a variable resistance nonvolatile semiconductor memory element which overcomes the above problems, is able to operate at a low voltage and high speed when breakdown is caused, and inhibit oxidation of a contact plug, and, in particular, to provide a method for manufacturing a resistance change nonvolatile semiconductor memory element which can significantly contribute to the miniaturization and an increase of capacity, of the memory.

Solution to Problem

To achieve the above objects, a method for manufacturing a nonvolatile semiconductor memory element according to one embodiment of the present invention including: forming a contact plug above a substrate; depositing a first conductive film so that the contact plug is covered therewith; depositing, on the first conductive film, a variable resistance film including multiple layers having different oxygen content percentages; depositing a second conductive film on the variable resistance film; forming a top electrode by patterning the second conductive film; forming a variable resistance layer by patterning the variable resistance film; and forming a bottom electrode connected to the contact plug, by patterning the first conductive film, the method further comprising oxidizing to insulate an end portion of the variable resistance layer or a portion of the variable resistance film which is to be the end portion of the variable resistance layer, at least prior to forming the bottom electrode.

Using the manufacturing method described above, the sidewall portion of the variable resistance element is oxidized and insulated. Thus, the size of an active area (an effective area affecting the electrical characteristics of the element) is reduced, thereby achieving reduction of the leakage current, a decrease of the breakdown voltage, and shortening of the time for which the breakdown voltage is applied. At the same time, the sidewall of the variable resistance layer is oxidized prior to the bottom electrode being patterned. Thus, the conductive layer deposited on the entire surface functions as a barrier to oxygen diffusion, allowing fundamental prevention of oxidization of the contact plug.

Moreover, in the above-described method for manufacturing the nonvolatile semiconductor memory element, oxidizing the variable resistance layer or the variable resistance film may be oxidizing to insulate the end portion of the variable resistance layer after forming the variable resistance layer. This has an effect in preventing desorption of oxygen from the end portion of the variable resistance layer. In particular, oxidization immediately after the variable resistance film is patterned shortens a time for which the variable resistance layer is left in an atmosphere, reducing factors whereby the variable resistance layer varies. In addition, an oxide region, of the sidewall, which is formed at the end portion functions as a protective layer, reducing etch damage to the variable resistance layer upon patterning the bottom electrode.

Moreover, in the above-described method for manufacturing the nonvolatile semiconductor memory element, oxidizing the variable resistance layer or the variable resistance film may be oxidizing to insulate the portion of the variable resistance film after forming the top electrode and before forming the variable resistance layer. This prevents the variable resistance film from being patterned upon the oxidization process, thus enhancing the barrier to the oxygen diffusion. Therefore, the oxidization of the contact plug can be prevented at high probability. Moreover, if the oxidization is performed while the variable resistance film remains on the enter surface, a rate of variable resistance film oxidization increases, allowing reduction of the active area of the variable resistance element. Therefore, the leakage current can further be reduced. In addition, the variable resistance film, which is an etching target, includes a high amount of oxygen, and thus, an oxide region, of the sidewall, which is formed in the variable resistance film functions as a protective layer, thereby reducing etch damage upon patterning the variable resistance film and the first conductive film.

Moreover, in the above-described method for manufacturing the nonvolatile semiconductor memory element may include forming, above the top electrode, an anti-stress layer having a higher compressive stress than the top electrode. This allows prevention of the warping of the top electrode due to variation in stress even if the oxidization is performed in a state in which a first conductive layer to be the bottom electrode and the variable resistance film to be the variable resistance layer remain across the entire surface.

Last, the variable resistance layer may be a tantalum oxide layer, a hafnium oxide layer, or a zirconium oxide layer. These materials have excellent retention characteristics and allow high-speed operation. Although any of these materials if included in the variable resistance layer requires the breakdown at the start of the resistance change, the effects of the present invention allows the breakdown characteristic to be significantly stabilized.

Advantageous Effects of Invention

A method for manufacturing a nonvolatile semiconductor memory element according to the present invention oxidizes the sidewall of the variable resistance layer prior to patterning a bottom electrode in the variable resistance element which includes a top electrode, a variable resistance layer, and a bottom electrode that are formed above a contact plug, thereby achieving both a decrease of the breakdown voltage and shortening of the time for which the breakdown voltage is applied which are due to the reduction of the effective area of the variable resistance layer, and prevention of oxidization of the contact plug. This is because a conductive layer which is not patterned and is to be the bottom electrode functions as a barrier to oxygen diffusion, allowing fundamental prevention of oxidization of the contact plug. The method for manufacturing the nonvolatile semiconductor memory element, according to the present invention, can significantly contribute, in particular, to reduction in size and an increase in capacity of the memory.

DESCRIPTION OF EMBODIMENTS

Hereinafter, embodiments of the present invention will be described with accompanying drawings. It should be noted that values of film thicknesses, pore sizes, and the like described in each embodiment below are merely illustrative, and are not limited thereto.

Embodiment 1

Figure 1:
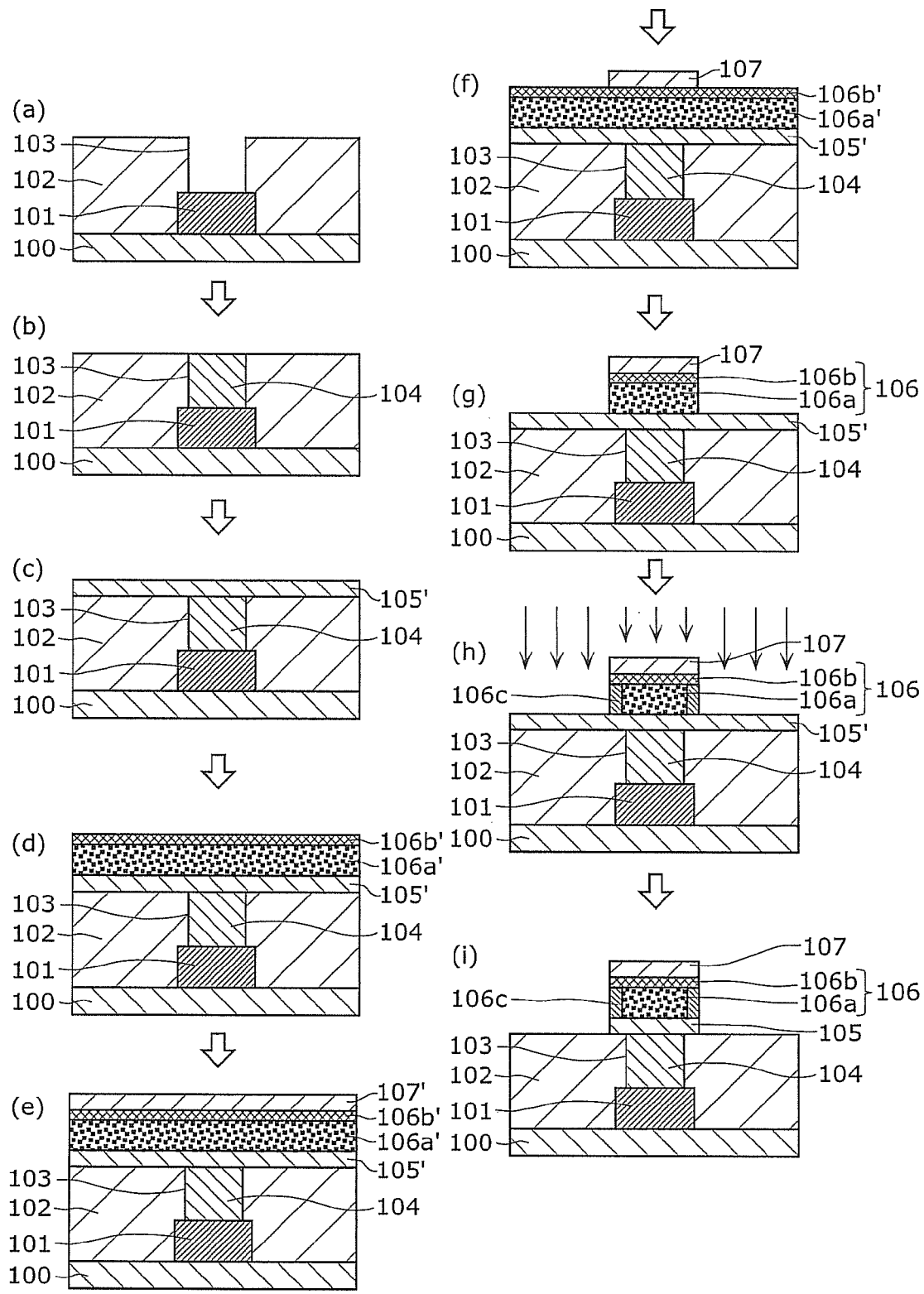
FIG. 1 is a cross-sectional view showing a method for manufacturing main part of a nonvolatile semiconductor memory element, according to an embodiment 1 of the present invention.

FIG. 1 is a cross-sectional view showing a method for manufacturing main part of a nonvolatile semiconductor memory element, according to an embodiment 1 of the present invention.

First, as shown in (a) of FIG. 1, above a substrate 100 above which a transistor, an underlying line, and the like are formed, a conductive layer (film thickness: 400 nm to 600 nm) comprising aluminum or the like is formed. The obtained conductive layer is patterned to form an underlying line 101. Then, an insulating film is formed above the substrate 100, covering the underlying line 101, and thereafter a surface of an insulating layer is planarized to form an interlayer insulating layer 102 (film thickness: 500 nm to 1000 nm). For the interlayer insulating layer 102, a plasma TEOS film and, for reduction of parasitic capacitance between lines, a fluorine-containing oxide (for example, FSG) and a low-k material or the like are used. Then, the interlayer insulating layer 102 is patterned using a desired mask to form a contact hole 103 (diameter: 50 nm to 300 nm), extending through the interlayer insulating layer 102 to the underlying line 101. Here, if a width of the underlying line 101 is smaller than a diameter of the contact hole 103, an area in contact between the underlying line 101 and the contact plug 104 changes due to misalignment of the mask, causing, for example, a cell current to change. To prevent this, the width of the underlying line 101 has an outline greater than the diameter of the contact hole 103.

Next, as shown in (b) of FIG. 1, first, a titanium nitride layer (TiN, film thickness: 5 nm to 50 nm) and a titanium layer (Ti, film thickness: 5 nm to 30 nm) each functioning as an adhesion layer and a diffusion barrier are deposited as a bottom layer by a sputtering method, and tungsten (W, film thickness: 200 nm to 400 nm), which is a principal component of a top layer, is deposited by a CVD method. As a result, the first contact hole 103 is filled with a filler material comprising tungsten as a principal component. Then, the planarization polishing is performed on an entire wafer surface, using the chemical mechanical polishing (CMP), to remove unnecessary portion of the filler material on the interlayer insulating layer 102 to form the contact plug 104 inside the contact hole 103 and above the substrate 100.

Next, as shown in (c) of FIG. 1, a first conductive film 105' (TaN, film thickness: 50 nm to 200 nm), which is to be a bottom electrode 105 and comprises a tantalum nitride, is formed (deposited) above the interlayer insulating layer 102 by the sputtering method, covering the contact plug 104.

Next, as shown in (d) of FIG. 1, above the first conductive film 105', a variable resistance film including multiple layers having different oxygen content percentages, namely, a first variable resistance film 106a' and a second variable resistance film 106b' each comprising a transition metal oxide are formed (deposited) in the stated order. The first variable resistance film 106a' has an oxygen content percentage of 50 atm % to 65 atm %, the resistivity of 2 mΩ·cm to 50 mΩ·cm, and a film thickness of 20 nm to 100 nm. The second variable resistance film 106b' has an oxygen content percentage of 65 atm % to 75 atm %, the resistivity of 1E7Ω·cm or greater, and a film thickness of 3 nm to 10 nm. Here, the first variable resistance film 106a' and the second variable resistance film 106b' are formed by what is called a reactive sputtering method in which a tantalum target is sputtered in an atmosphere containing argon gas (Ar) and oxygen gas ($O_2$). It should be noted that the first variable resistance film 106a' is a film having a low oxygen concentration and a low resistance as compared to the second variable resistance film 106b'.

Next, as shown in (e) of FIG. 1, the second conductive film 107', which is to be a top electrode 107 after being patterned, and comprises a noble metal (such as platinum (Pt), iridium (Ir), and palladium (Pd)), is formed (deposited) above the second variable resistance film 106b'.

Next, as shown in (f) of FIG. 1, a second conductive film 107' is patterned using the desired mask, and the patterned second conductive film 107' is formed as the top electrode 107.

Next, as shown in (g) of FIG. 1, the first variable resistance film 106a' and the second variable resistance film 106b' are patterned using the desired mask. For example, the variable resistance film may be patterned using the top electrode 107, which is a difficult-to-etch material, as the mask. The patterned variable resistance film is formed as the variable resistance layer 106 which has a two-layer structure including the first variable resistance layer 106a and the second variable resistance layer 106b. In this case, preferably, the variable resistance film is patterned under conditions in which the first conductive film 105' to be the bottom electrode 105 is hardly etched. For example, preferably, the first variable resistance film 106a' and the second variable resistance film 106b' are dry etched using a gas thereby the first conductive film 105' is hardly etched. This is because the greater a remaining film thickness of the first conductive film 105' is, the more certainly the first conductive film 105' functions as a barrier to oxygen diffusion. It should be noted that the first variable resistance layer 106a is a variable resistance film having a low oxygen concentration and a low resistance as compared to the second variable resistance layer 106b.

Here, the first variable resistance layer 106a (the first variable resistance film 106a') comprising a transition metal oxide having a first transition metal oxide, for example, an oxygen-deficient tantalum oxide ($TaO_x$, $0<x<2.5$) as a principal component. An oxygen content percentage of a second transition metal oxide included in the second variable resistance layer 106b (the second variable resistance film 106b') is higher than an oxygen content percentage of the first transition metal oxide of which the first variable resistance layer 106a is formed. In other words, composition ratio of oxygen in the second transition metal oxide is higher than composition ratio of oxygen in the first transition metal oxide. For example, if the second variable resistance layer 106b comprises a tantalum oxide ($TaO_y$), conditions, $x<y$, is satisfied. If the first variable resistance layer 106a and the second variable resistance layer 106b comprise transition metals other than tantalum, the first variable resistance layer 106a and the second variable resistance layer 106b comprise materials the degree of shortage of oxygen of which is smaller than that of stoichiometric compositions exhibiting insulation properties. Alternatively, an oxide of hafnium (Hf) or zirconium (Zr) can be used as the material included in the variable resistance layer 106 to form a variable resistance layer having the same structure.

It should be noted that the oxygen-deficient transition metal oxide refers to an oxide having a small oxygen content (atomic ratio: a ratio of the number of oxygen atoms relative to the total number of atoms) as compared to an oxide having a stoichiometric composition. If the transition metal is Ta, a stoichiometric composition of oxide is represented by $Ta_2O_5$, and the atomic ratio (O/Ta) of Ta and O is 2.5. Thus, the atomic ratio of Ta and O in the oxygen-deficient Ta-oxide is greater than 0 and smaller than 2.5.

Next, as shown in (h) of FIG. 1, by annealing (temperature: 300 to 450° C.) the variable resistance element, in which the first conductive film 105' is not patterned, in an atmosphere containing oxygen (hereinafter, simply referred to as annealing), an end portion (side end portion) of the first variable resistance layer 106a is oxidized to be insulated to form an insulating region 106c. If the second variable resistance layer 106b is initially in close proximity to the insulating layer, the second variable resistance layer 106b is hardly oxidized. In addition, the oxidation is performed in a state in which a surface of the first conductive film 105' is exposed, and thus, an oxide layer (not shown) is formed on the surface of the first conductive film 105'. In the case of the present embodiment, a surface of the tantalum nitride is oxidized and the tantalum nitride turns to be a tantalum oxide or a tantalum oxynitride.

Last, as shown in (i) of FIG. 1, using the desired mask, for example, using the top electrode 107 as the mask, the first conductive film 105' is patterned, and the patterned first conductive film 105' is formed as the bottom electrode 105 which is connected to the contact plug 104. As a result, the variable resistance element in which the variable resistance layer 106 is interposed between the bottom electrode 105 and the top electrode 107 is formed. In this case, a film quality of a portion of the first conductive film 105' that is close to the surface thereof is changed due to the oxidation. Therefore, there are tendencies that a time for which the first conductive film 105' is etched is longer than normal, and a bottom dimension of the variable resistance element increases.

Typically, the subsequent steps include a step of covering the variable resistance element with an interlayer insulating film, a step of forming a contact plug which is connected to the top electrode of the variable resistance element, a step of forming an overlying line which is connected to the contact plug, and the like (not shown). By carrying out these steps, the nonvolatile semiconductor memory element according to the embodiment 1 of the present invention can be achieved.

Using the manufacturing method described above, in the method for manufacturing the variable resistance element including the top electrode 107, the variable resistance layer 106, and the bottom electrode 105 that are formed above the contact plug 104, a sidewall of the variable resistance layer 106 is oxidized prior to the formation of the bottom electrode 105. This reduces the size of an active area of the variable resistance layer, thereby achieving both a decrease of the breakdown voltage and shortening of the time for which the breakdown is caused, and prevention of oxidization of the contact plug.

Figure 2:
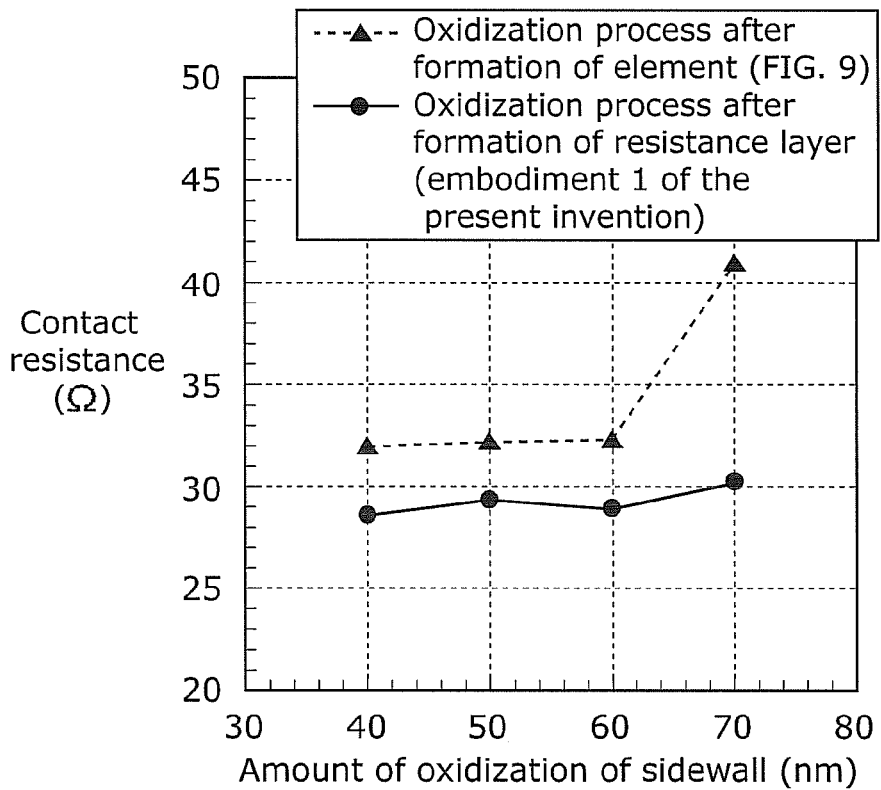
FIG. 2 is a graph showing relationship between contact resistance and an amount of oxidation of a sidewall of the nonvolatile semiconductor memory element according to the embodiment 1 of the present invention.

FIG. 2 shows relationship between contact resistance of the contact plug and an amount of oxidation of the sidewall of the nonvolatile semiconductor memory element according to the embodiment 1 of the present invention that is created by the manufacturing method described above. In FIG. 2, the amount of oxidation of the sidewall of the variable resistance layer 106 is indicated on the horizontal axis, and the contact resistance of the contact plug 104 is indicated on the vertical axis. The amount of oxidation of the sidewall is an estimated amount obtained by using a monitor wafer having the variable resistance layer 106 formed on the entire wafer surface, oxidizing an obtained surface of the monitor wafer for a same time period for which the sidewall is oxidized, and measuring, using an optical film thickness gauge, an amount of oxidation proceeding in a vertical direction from the surface of the variable resistance layer 106. Due to effects from other factors, the actual amount of oxidation proceeding in the sidewall of the variable resistance element may be different from the amount of oxidation of the sidewall measured using the monitor wafer. It is, however, probable that the qualitative characteristics remain the same. As can be seen from FIG. 2, in the manufacturing method shown in FIG. 9 in which the annealing is performed after the formation of the variable resistance element (after the formation of the bottom electrode), the amount of oxidation rapidly increases above 40Ω when the amount of oxidation of the sidewall reaches 70 nm when the contact resistance is about 32Ω. This suggests that oxygen reaches the contact plug 104 due to an increase of the amount of oxidation of the sidewall, causing a bit in which the contact plug 104 is oxidized. On the other hand, it can be seen that, in the manufacturing method according to the embodiment 1 of the present invention, the contact resistance is as low as 30Ω or less and does not increase even if the amount of oxidation of the sidewall increases.

Figure 3:
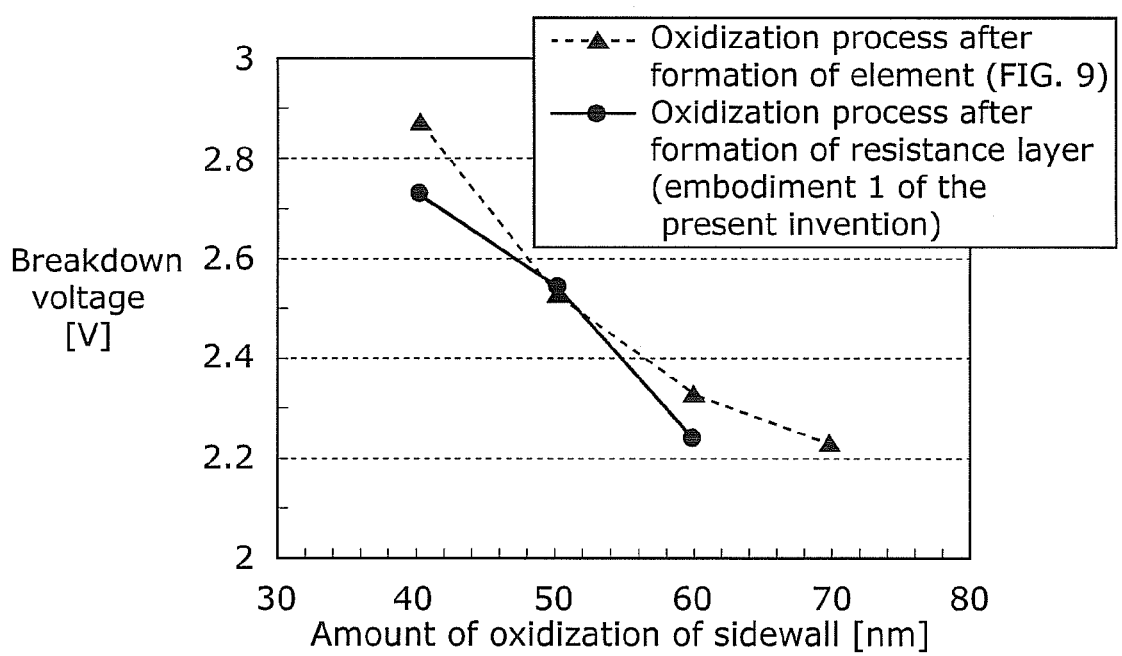
FIG. 3 is a graph showing relationship (breakdown voltage characteristics) between the initial breakdown voltage and the amount of oxidation of the sidewall of the nonvolatile semiconductor memory element according to the embodiment 1 of the present invention.

FIG. 3 shows relationship between the amount of oxidation of the sidewall and the breakdown voltage in the nonvolatile semiconductor memory element according to the embodiment 1 of the present invention. In FIG. 3, the amount of oxidation of the sidewall of the variable resistance layer 106 is indicated on the horizontal axis, and the breakdown voltage of the variable resistance element is indicated on the vertical axis. It is confirmed that, as with the manufacturing method shown in FIG. 9 in which the annealing is performed after the formation of the variable resistance element, the active area of the variable resistance element reduces by increasing the amount of oxidation of the sidewall, causing effects in reducing the breakdown voltage.

Figure 4A:
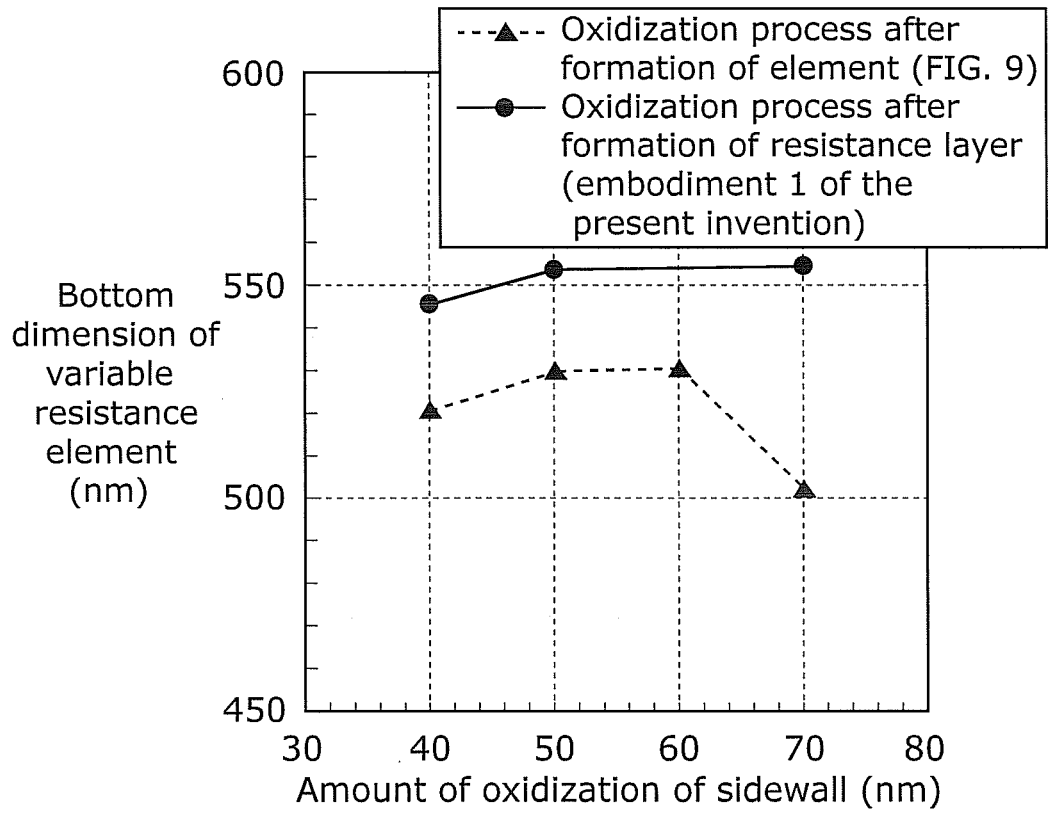
FIG. 4A is a graph showing relationship between a bottom dimension of a variable resistance element and the amount of oxidation of the sidewall of the nonvolatile semiconductor memory element according to the embodiment 1 of the present invention.
Figure 4B:
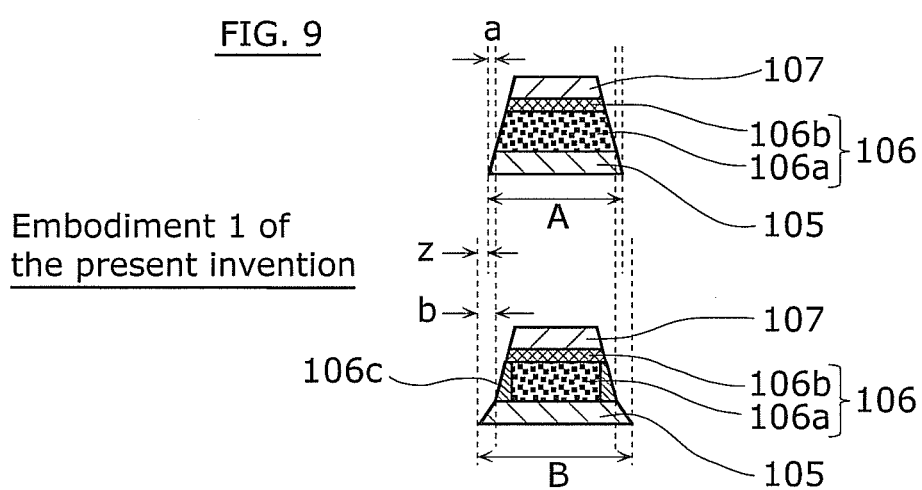
FIG. 4B is a cross-sectional view showing the variable resistance element by the manufacturing method according to the embodiment 1 of the present invention and a variable resistance element by a manufacturing method illustrated in FIG. 9.
Figure 9:
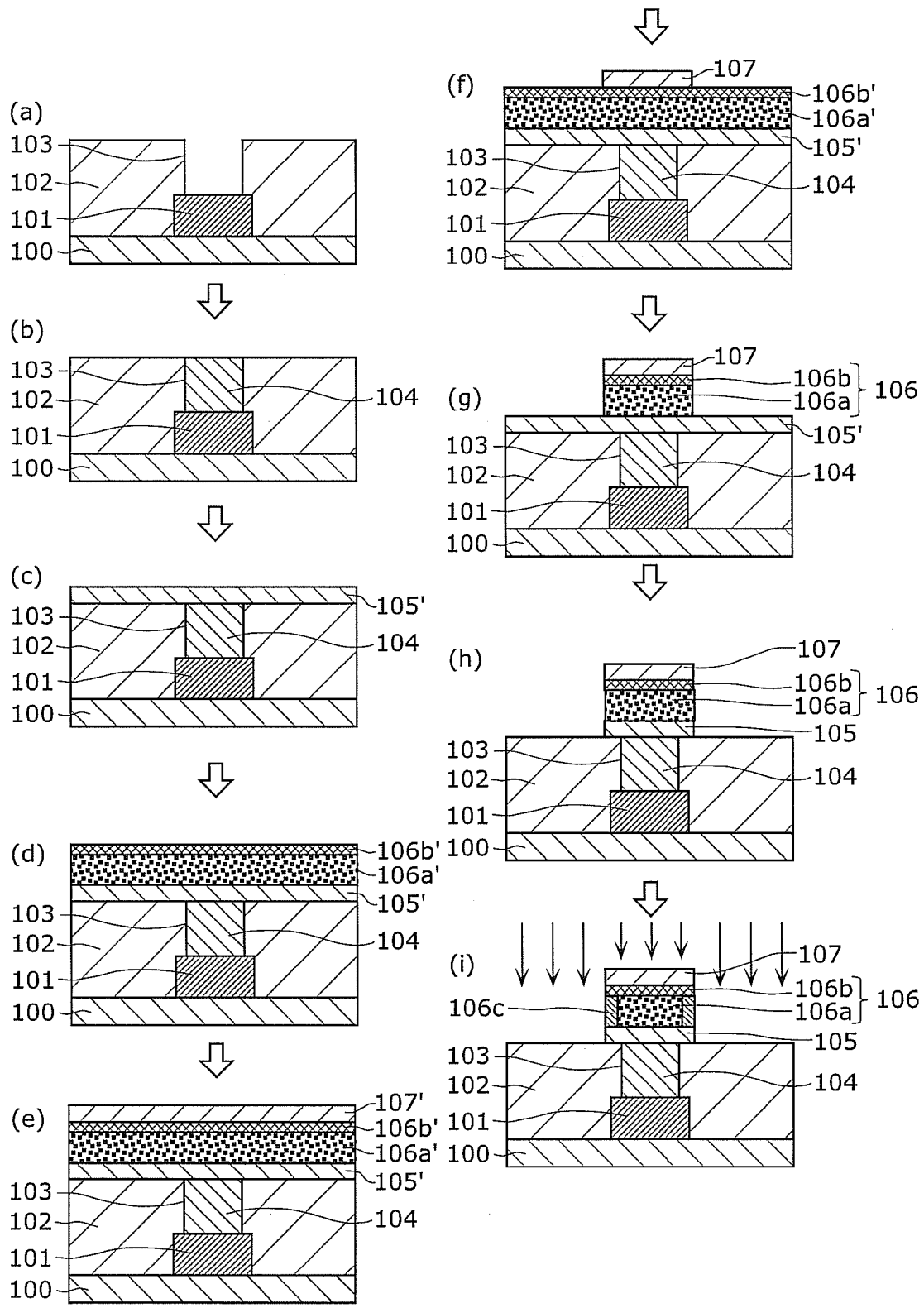
FIG. 9 is a cross-sectional view showing a method for manufacturing main part of a nonvolatile semiconductor memory element.
Figure 10:
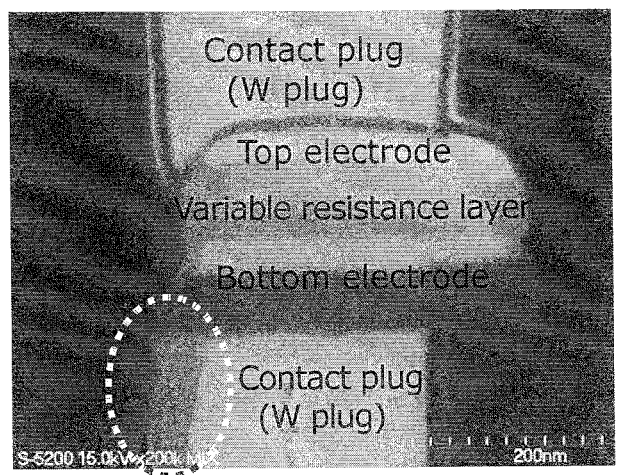
FIG. 10 is a cross-sectional SEM image of the nonvolatile semiconductor memory element.

Last, how the difference in step of performing the oxidation of the sidewall affects the bottom dimension of the variable resistance element will be described. FIG. 4A shows relationship between the amount of oxidation of the sidewall of the nonvolatile semiconductor memory element according to the embodiment 1 of the present invention and the bottom dimension of the variable resistance element. In FIG. 4A, the amount of oxidation of the sidewall of the variable resistance layer is indicated on the horizontal axis, and the bottom dimension of the variable resistance element is indicated on the vertical axis. FIG. 4B shows the variable resistance element by the manufacturing method according to the embodiment 1 of the present invention and the variable resistance element according to the manufacturing method shown in FIG. 9. It can be seen from FIG. 4B that a bottom dimension B of the variable resistance element by the manufacturing method according to the embodiment 1 of the present invention is greater than a bottom dimension A of the variable resistance element shown in FIG. 9. The bottom dimension B is annealed immediately after the formation of the variable resistance layer, and the bottom dimension A is annealed after the formation of the variable resistance element (after the formation of the bottom electrode). This is due to difference in state of the surface of the bottom electrode 105 upon etching. In the embodiment 1 of the present invention, oxidation is performed on the variable resistance layer 106 prior to processing the bottom electrode 105, and thus the surface of the bottom electrode 105 is oxidized. Due to this, when the same etching as shown in FIG. 9 is performed on the bottom electrode 105, the etching of the bottom electrode 105 hardly proceeds due to the bottom electrode 105 including oxygen, resulting in the bottom electrode 105 having a taper shape. That is, a difference b between a top dimension and the bottom dimension of the bottom electrode 105 formed by the manufacturing method according to the embodiment 1 of the present invention is greater than a difference a between a top dimension and the bottom dimension of the bottom electrode 105 formed by the manufacturing method shown in FIG. 9. The difference between the differences a and b results in the difference $(z=b-a=(B-A)/2)$ in bottom dimension of the variable resistance element. The size of an amount z depends on the film structure, dimension, and etching conditions of the variable resistance element. However, the difference still occurs.

Embodiment 2

Figure 5:
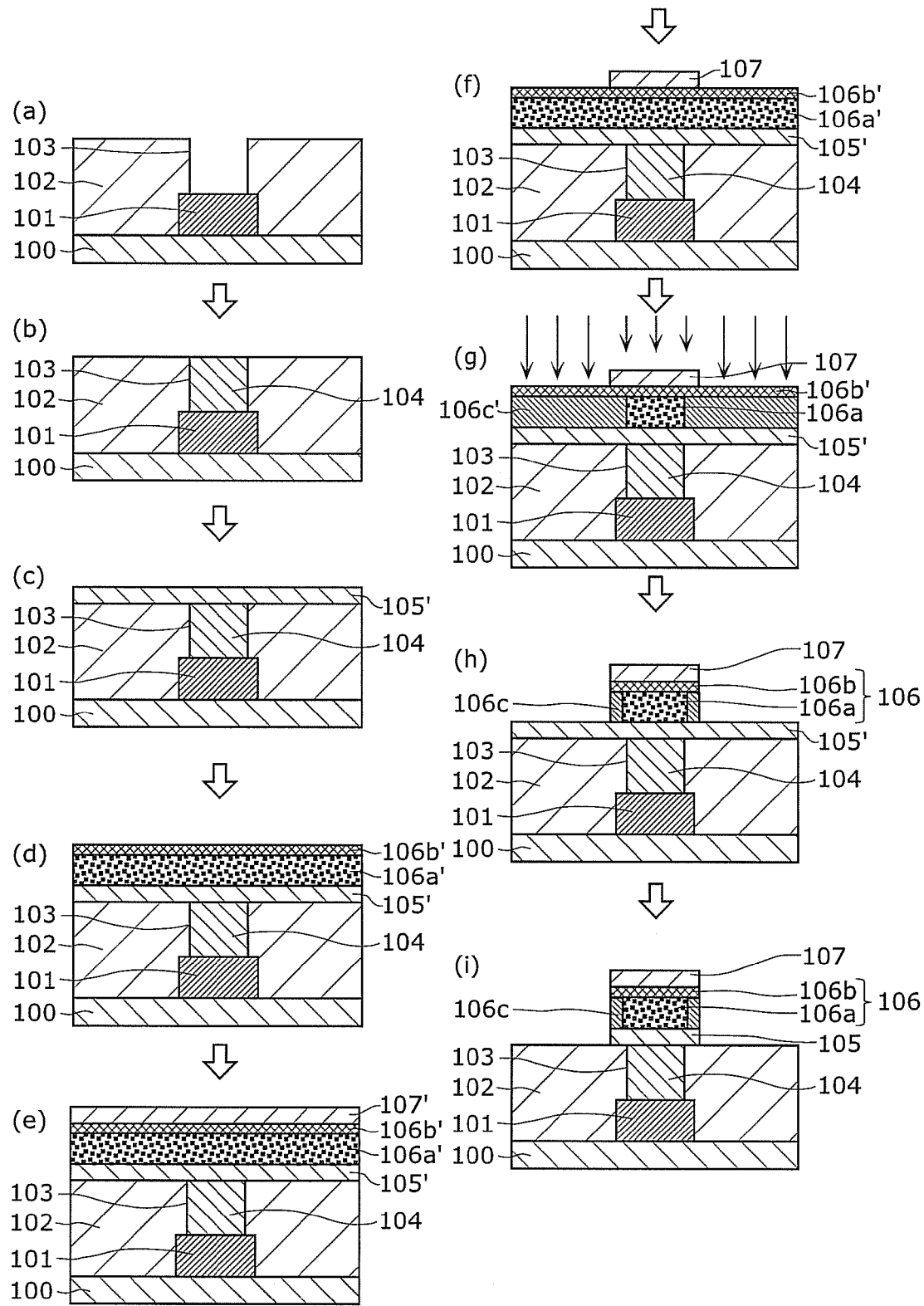
FIG. 5 is a cross-sectional view showing a method for manufacturing main part of a nonvolatile semiconductor memory element, according to an embodiment 2 of the present invention.

FIG. 5 is a cross-sectional view showing a method for manufacturing main part of a nonvolatile semiconductor memory element, according to an embodiment 2 of the present invention. In FIG. 5, the same reference signs are given to the same components as those shown in FIG. 1 and the description thereof will be omitted.

As shown in FIG. 5, the method for manufacturing the nonvolatile semiconductor memory element according to the embodiment 2 of the present invention is different from the method for manufacturing the nonvolatile semiconductor memory element, according to the embodiment 1 of the present invention with respect to a timing when an annealing process (a step of forming an insulating region 106c) for oxidizing the sidewall of the variable resistance element is performed. In the manufacturing method according to the embodiment 1 of the present invention, the annealing is performed to form the insulating region 106c after a first variable resistance film 106a' is patterned, namely, after a variable resistance layer 106 is formed. In the manufacturing method according to the embodiment 2 of the present invention, however, the annealing is performed to form the insulating region 106c after a second conductive film 107' is patterned, namely, during a period from when a top electrode 107 is formed to when the variable resistance layer 106 is formed by etching. Thus, steps prior to the step shown in (e) of FIG. 5 are the same as the steps shown in (a) through (e) of FIG. 1, and thus the description thereof will be omitted.

First, as shown in (f) of FIG. 5, the second conductive film 107' is patterned using a desired mask to form the top electrode 107 in a state in which a first conductive film 105' which is to be a bottom electrode 105, the first variable resistance film 106a' and a second variable resistance film 106b' each comprising a transition metal oxide, and the second conductive film 107' which is to be the top electrode 107 are formed above an interlayer insulating layer 102, covering a contact plug 104. In this case, preferably, the second conductive film 107' is patterned under conditions in which the first variable resistance film 106a' and the second variable resistance film 106b' are hardly etched. For example, preferably, the second conductive film 107' is dry etched using a gas thereby the first variable resistance film 106a' and the second variable resistance film 106b' are hardly etched. This is to prevent that if the remaining film thickness of the variable resistance film varies, variance in amount of oxidation of the sidewall occurs in the subsequent step which is annealing.

Next, as shown in (g) of FIG. 5, by annealing (temperature: 300 to 450° C.), in an atmosphere containing oxygen, the variable resistance element in which the first conductive film 105', the first variable resistance film 106a', and the second variable resistance film 106b' are not patterned, a portion of the first variable resistance film 106a' (a portion positioned between the top electrode 107 and the bottom electrode 105, which is to be an end portion of a first variable resistance layer 106a and exposed to the surface) is oxidized to be insulated to form an insulating region 106c'. Here, the oxidization proceeds not only in a film thickness direction, but also in a direction toward the inside of the variable resistance element. As described above, if the second variable resistance film 106b' is initially in close proximity to an insulating layer, the second variable resistance film 106b' is hardly oxidized. Moreover, depending on the degree of proceeding of the oxidization, a surface of the first conductive film 105' may be oxidized (not shown).

Next, as shown in (h) of FIG. 5, using a desired mask, for example, using the top electrode 107 as the mask, the first variable resistance film 106a' and the second variable resistance film 106b' (the insulating region 106c') are patterned to form a variable resistance layer 106 having a stacked structure including the first variable resistance layer 106a and the second variable resistance layer 106b. The oxide region proceeded inside the variable resistance element becomes the insulating region 106c and covers an end portion of the variable resistance element. Thus, the end portion of the variable resistance element is covered with the insulating region including a high amount of oxygen, thereby inhibiting penetration of an etching gas upon etching the variable resistance layer 106, or the like. Moreover, the second variable resistance layer 106b includes a high mount of oxygen due to the oxidization, and thus the film quality has changed. Therefore, there are tendencies that a time for which the etching is performed is longer than normal, and a bottom dimension of the variable resistance element increases.

Last, as shown in (i) of FIG. 5, using the desired mask, for example, using the top electrode 107 as the mask, the first conductive film 105' is patterned to form the bottom electrode 105. As a result, a variable resistance element in which the variable resistance layer 106 is interposed between the bottom electrode 105 and the top electrode 107 is formed.

Typically, the subsequent steps include a step of covering the variable resistance element with an interlayer insulating film, a step of forming a contact plug which is connected to the top electrode of the variable resistance element, a step of forming an overlying line which is connected to the contact plug, and the like (not shown). By carrying out these steps, the nonvolatile semiconductor memory element according to the embodiment 2 of the present invention can be achieved.

Using the manufacturing method described above, in the method for manufacturing the variable resistance element including the top electrode 107, the variable resistance layer 106, and the bottom electrode 105 that are formed above the contact plug 104, a sidewall of the variable resistance layer 106 is oxidized prior to the formation of the bottom electrode 105. This reduces the size of an effective area of the variable resistance layer, thereby achieving both a decrease of the breakdown voltage and shortening of the time for which the breakdown is caused, and prevention of oxidization of the contact plug.

Figure 6:
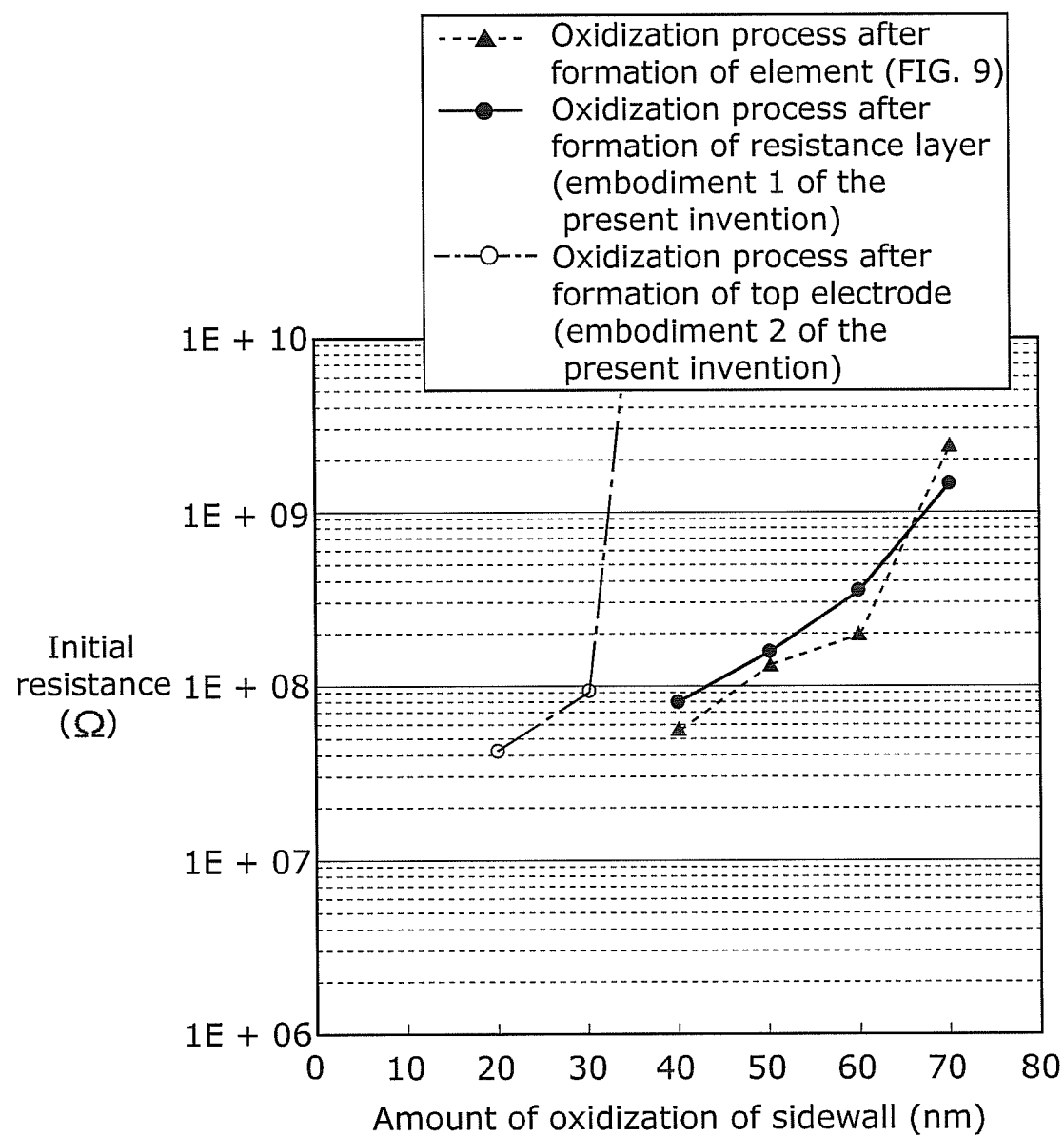
FIG. 6 is a graph showing relationship between initial resistance and an amount of oxidation of a sidewall of the nonvolatile semiconductor memory element according to the embodiment 2 of the present invention.

The nonvolatile semiconductor memory element according to the embodiment 2 of the present invention that is created by the manufacturing method described above has the below-described advantages as compared to the nonvolatile semiconductor memory element according to the embodiment 1 of the present invention. FIG. 6 shows relationship between initial resistance and the amount of oxidation of the sidewall of the nonvolatile semiconductor memory element by the manufacturing method according to the embodiment 2 of the present invention. In FIG. 6, the amount of oxidation of the sidewall of the variable resistance layer 106 is indicated on the horizontal axis, and the initial resistance of the variable resistance element is indicated on the vertical axis. The amount of oxidation of the sidewall is an amount of oxidation proceeding in a vertical direction of the above-described monitor wafer and is a certain measure. It can be seen from FIG. 6 that, as compared to the manufacturing method shown in FIG. 9 and the manufacturing method according to the embodiment 1 of the present invention, in the manufacturing method according to the embodiment 2 of the present invention, the amount of oxidation of the sidewall required to obtain the same initial resistance (to form the same insulating region 106c) is small. In other words, it can be seen that if the variable resistance layer 106 is oxidized immediately after the top electrode 107 is formed, an effective rate of sidewall oxidization increases, allowing the oxidization further inside of the variable resistance element. While not clear, inference is made that the reason for this is due to the fact that when via the variable resistance layer the diffusion coefficient of oxygen in the variable resistance layer increases.

Embodiment 3

It is confirmed from FIG. 6 described above that if the annealing for oxidizing the sidewall of the variable resistance element is performed immediately after the formation of the top electrode 107, the effective rate of sidewall oxidization increases. However, on the other hand, it is also found that if the oxidization of the sidewall is excessive, the initial resistance in an extremely high resistance, and thus the breakdown cannot be caused in some memory cells. The analysis is made for this and has proven that the cause is the delamination of the top electrode 107. It is considered that the oxidization process in a state in which the variable resistance layer 106 remains on the entire surface causes a large variation in stress, thereby the top electrode 107 is affected and delaminated. A manufacturing method according to the embodiment 3 of the present invention solves the problem.

Figure 7:
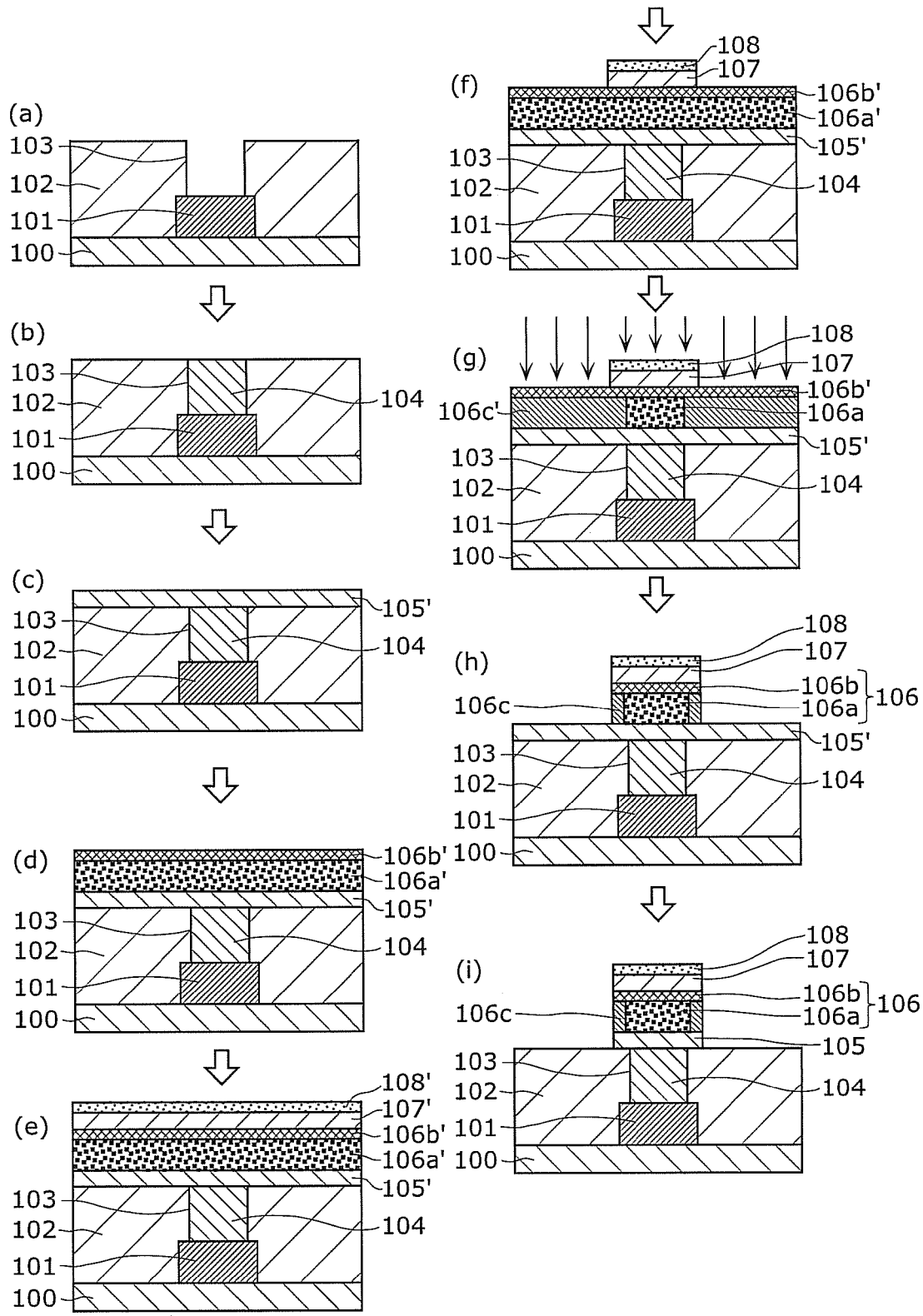
FIG. 7 is a cross-sectional view showing a method for manufacturing main part of a nonvolatile semiconductor memory element, according to an embodiment 3 of the present invention.

FIG. 7 is a cross-sectional view showing a method for manufacturing main part of a nonvolatile semiconductor memory element, according to an embodiment 3 of the present invention. In FIG. 7, the same reference signs are given to the same components as those shown in FIG. 1 and the description thereof will be omitted.

As shown in FIG. 7, the method for manufacturing the nonvolatile semiconductor memory element according to the embodiment 3 of the present invention is different from the method for manufacturing the nonvolatile semiconductor memory element according to the embodiment 2 of the present invention in that an anti-stress layer 108 is disposed above a top electrode 107 in the manufacturing method according to the embodiment 3 of the present invention. Thus, steps prior to a step shown in (d) of FIG. 7 are the same as the steps shown in (a) through (d) of FIG. 5, and steps subsequent to the step shown in (h) of FIG. 7 are the same as the steps shown in (h) through (i) of FIG. 5. Therefore, the description thereof will be omitted.

First, as shown in (e) of FIG. 7, a first conductive film 105' which is to be a bottom electrode 105, a first variable resistance film 106a' and a second variable resistance film 106b' each comprising a transition metal oxide, a second conductive film 107' which is to be the top electrode 107, and an anti-stress film 108' are formed above an interlayer insulating layer 102 in the stated order, covering a contact plug 104. To inhibit tensile stress by annealing to be performed, an anti-stress film having a higher compressive stress than the second conductive film 107' (the top electrode 107) is used for the anti-stress film 108'. In other words, to enhance stress tolerance to a tensile stress caused in the top electrode 107 due to annealing (formation of an insulating region 106c'), an anti-stress film which has, as a characteristic in forming the film, a higher stress having a opposite polarity, namely, a higher compressive stress than the stress caused in the top electrode 107 is used for the anti-stress film 108'. Here, a nitride of titanium and aluminum (TiAlN) is selected as a material included in the anti-stress film 108'. The anti-stress film 108' is not necessarily conductive. This is because if the anti-stress film 108' is insulative, the anti-stress layer 108 may also be opened (a through hole to be filled with the contact plug may be formed, extending so that the surface of the top electrode 107 is exposed) in forming the contact which is connected to the top electrode 107.

Next, as shown in (f) of FIG. 7, the second conductive film 107' and the anti-stress film 108' are patterned using a desired mask to form the top electrode 107 and the anti-stress layer 108 thereabove, respectively. In this case also, preferably, the second conductive film 107' and the anti-stress film 108' are patterned under conditions in which the first variable resistance film 106a' and the second variable resistance film 106b' are hardly etched. For example, preferably, the second conductive film 107' and the anti-stress film 108' are dry etched using a gas thereby the first variable resistance film 106a' and the second variable resistance film 106b' are hardly etched. This is to prevent that if the remaining film thickness of the variable resistance film varies after the second conductive film 107' and the anti-stress film 108' are patterned, variance in amount of oxidation of the sidewall occurs in the subsequent step which is annealing.

Next, as shown in (g) of FIG. 7, by annealing (temperature: 300 to 450° C.), in an atmosphere containing oxygen, the variable resistance element in which the first conductive film 105', the first variable resistance film 106a', and the second variable resistance film 106b' are not patterned, a portion of the first variable resistance film 106a' is oxidized to form the insulating region 106c'. Here, the oxidization proceeds not only in a film thickness direction, but also in a direction toward the inside of the variable resistance element. As described above, if the second variable resistance film 106b' is initially in close proximity to an insulating layer, the second variable resistance film 106b' is hardly oxidized. Moreover, depending on the degree of proceeding of the oxidization, a surface of the first conductive film 105' may be oxidized (not shown). In the step shown in (g) of FIG. 7, disposition of the anti-stress layer 108 can inhibit warping of the top electrode 107 and prevent delamination of the top electrode 107.

By carrying out the same steps as those shown in (h) through (i) of FIG. 5, the nonvolatile semiconductor memory element according to the embodiment 3 of the present invention can be achieved.

Using the manufacturing method described above, in the method for manufacturing the variable resistance element including the top electrode 107, the variable resistance layer 106, and the bottom electrode 105 that are formed above the contact plug 104, the sidewall of the variable resistance layer 106 is oxidized prior to the formation of the bottom electrode 105. This allows achievement of both a decrease of the breakdown voltage and shortening of the time for which the breakdown is caused which are due to the reduction of the effective area of the variable resistance layer, and prevention of oxidization of the contact plug.

Figure 8A:
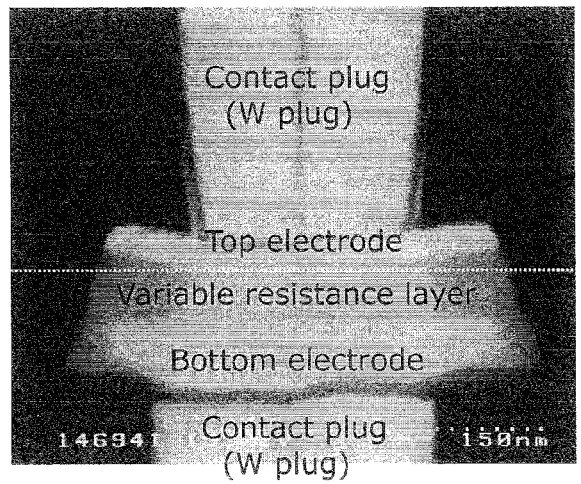
FIG. 8A is a cross-sectional SEM image of an example as comparison to the nonvolatile semiconductor memory element according to the embodiment 3 of the present invention.
Figure 8B:
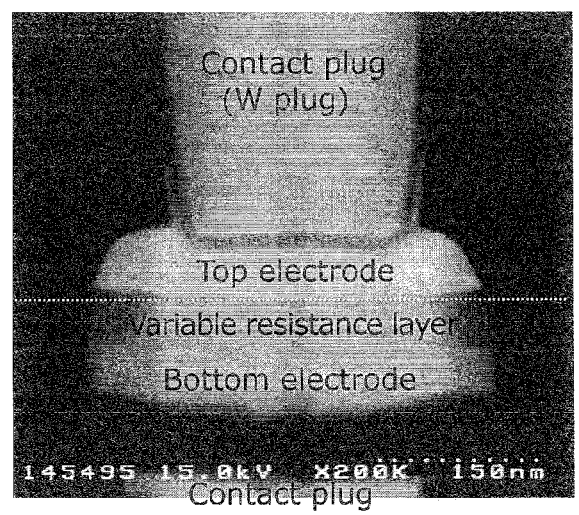
FIG. 8B is a cross-sectional SEM image of an example as comparison to the nonvolatile semiconductor memory element according to the embodiment 3 of the present invention.
Figure 8C:
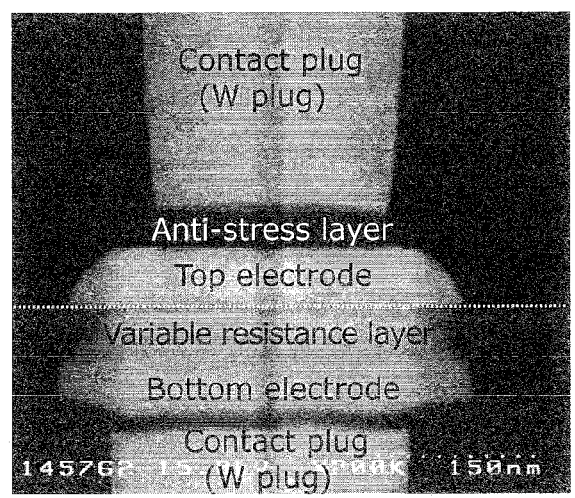
FIG. 8C is a cross-sectional SEM image of the nonvolatile semiconductor memory element according to the embodiment 3 of the present invention.

Moreover, the nonvolatile semiconductor memory element according to the embodiment 3 of the present invention that is created by the manufacturing method described above has the below-described advantages as compared to the nonvolatile semiconductor memory element according to the embodiment 2 of the present invention. FIGS. 8A, 8B, and 8C each show a cross-sectional SEM image of a nonvolatile semiconductor memory element. FIG. 8A and FIG. 8B show a variable resistance element in which the anti-stress layer 108 is not disposed, suggesting prominent warping of the electrode which may lead to delamination of the top electrode 107. It is in addition suggested that the thinner the top electrode 107 is, the greater the amount of warping becomes, and variation in film thickness of the top electrode 107 affects the characteristics of the variable resistance element. As shown in FIG. 8C, however, it can be seen that, when the anti-stress layer 108 (a nitride of titanium and aluminum) is disposed above the top electrode 107, the top electrode 107 has no warping without delamination concerns.

While the method for manufacturing the nonvolatile semiconductor memory element according to the present invention has been described based on the embodiments, the present invention is not limited to the embodiments. Various modifications to the present embodiments that may be conceived by those skilled in the art are included in the scope of the present invention, without departing from the essence of the present invention. Moreover, the components of a plurality of the embodiments may arbitrary be combined without departing from the spirit of the present invention.

For example, while, in the above-described embodiments, the transition metal oxide layer including the first variable resistance layer 106a and the second variable resistance layer 106b is the tantalum oxide layer, other transition metal oxide layer, such as a hafnium (Hf) oxide layer or a zirconium (Zr) oxide layer, may be used insofar as the transition metal oxide layer functions as the variable resistance layer by the application of a voltage to the top electrode and the bottom electrode.

For example, if a stacked structure including a hafnium oxide layer is employed for the variable resistance layer 106, preferably, when a composition of a first hafnium oxide layer is represented by $HfO_x$ and a composition of a second hafnium oxide layer is represented by $HfO_y$, conditions about $0.9 \leq x \leq$ about 1.6 is satisfied, y satisfies about $1.8<y$, and a film thickness of the second hafnium oxide layer is equal to or greater than 3 nm and equal to or less than 4 nm.

Moreover, if a stacked structure including the zirconium oxide layer is employed for the variable resistance layer 106, preferably, when a composition of a first zirconium oxide layer is represented by $ZrO_x$, and a composition of a second zirconium oxide layer is represented by $ZrO_y$, conditions about $0.9 \leq x \leq$ about 1.4 is satisfied, y satisfies about $1.9<y$, and a film thickness of the second zirconium oxide layer is equal to or greater than 1 nm and equal to or less than 5 nm.

Moreover, if the stacked structure including the hafnium oxide layer is employed for the variable resistance layer 106, the first hafnium oxide layer is formed above the bottom electrode 105 by what is called a reactive sputtering method in which an Hf target is used and sputtered in argon gas and oxygen gas. After the formation of the first hafnium oxide layer, the second hafnium oxide layer can be formed by exposing a surface of the first hafnium oxide layer to plasma comprising argon gas and oxygen gas. An oxygen content percentage of the first hafnium oxide layer can readily be adjusted, in the same manner as with the above-described tantalum oxide layer, by changing a ratio of the oxygen gas flow rate to argon gas during the reactive sputtering. It should be noted that the substrate temperature is not necessarily heated and may be a room temperature.

Moreover, the film thickness of the second hafnium oxide layer can readily be adjusted by duration of exposure to the plasma comprising argon gas and oxygen gas.

If the stacked structure including the zirconium oxide layer is employed, the first zirconium oxide layer is formed above the bottom electrode 105 by what is called a reactive sputtering method in which a Zr target is used and sputtered in argon gas and oxygen gas. After the formation of the first zirconium oxide layer, the second zirconium oxide layer can be formed by exposing a surface of the first zirconium oxide layer to the plasma comprising argon gas and oxygen gas. An oxygen content percentage of the first zirconium oxide layer can readily be adjusted, in the same manner as with the above-described tantalum oxide layer, by changing a ratio of the oxygen gas flow rate to argon gas during the reactive sputtering. It should be noted that substrate temperature is not necessarily heated and may be a room temperature.

Moreover, the film thickness of the second zirconium oxide layer can readily be adjusted by duration of exposure to the plasma comprising argon gas and oxygen gas.

Moreover, the materials of the top electrode 107 and the bottom electrode 105 described in the above embodiments are by way of example, and other materials may be used. For example, as the top electrode 107, a material having a greater standard electrode potential than a standard electrode potential of a transition metal included in the variable resistance layer, such as Au (gold), copper (Cu), and silver (Ag) may be used in addition to Pt, Ir, and Pd. As the bottom electrode 105, a material having a smaller standard electrode potential than a standard electrode potential of the top electrode 107, such as tungsten (W) and nickel (Ni) may be used in addition to TaN. The top electrode 107 is disposed in contact with the second transition metal oxide layer 106b having a high oxygen content percentage.

Moreover, in the above embodiments, order in which the first variable resistance layer 106a and the second variable resistance layer 106b are stacked in the stacked structure of the variable resistance element may be opposite. That is, after the second variable resistance film 106b' and the first variable resistance film 106a' are sequentially formed above the first conductive film 105', the second variable resistance film 106b' and the first variable resistance film 106a' may be patterned and oxidized to form the variable resistance element. In this case, Pt, Ir, Pd, Au, copper, silver, or the like may be used for the first conductive film 105' (the bottom electrode 105) to which the second variable resistance film 106b' having a high oxygen content percentage is connected, and TaN, W, Ni, or the like may be used for the top electrode 107 to which the first variable resistance film 106a' having a low oxygen content percentage is connected.

INDUSTRIAL APPLICABILITY

The present invention is to provide a method for manufacturing a variable resistance nonvolatile semiconductor memory element which stably operates, has high reliability and is thus effective in various fields of electronics where nonvolatile memory is used.

REFERENCE SIGNS LIST

100 Substrate
101 Underlying line
102 Interlayer insulating layer
103 Contact hole
104 Contact plug
105 Bottom electrode
105' First conductive film
106 Variable resistance layer
106a First variable resistance layer
106a' First variable resistance film
106b Second variable resistance layer
106b' Second variable resistance film
106c, 106c' Insulating region
107 Top electrode
107' Second conductive film
108 Anti-stress layer
108' Anti-stress film

The invention claimed is:

1. A method for manufacturing a nonvolatile semiconductor memory element, comprising:
   forming a contact plug above a substrate;
   depositing a first conductive film so that the contact plug is covered therewith;
   depositing, on the first conductive film, a variable resistance film including multiple layers having different oxygen content percentages;
   depositing a second conductive film on the variable resistance film;
   forming a top electrode by patterning the second conductive film;
   forming a variable resistance layer by patterning the variable resistance film; and
   forming a bottom electrode connected to the contact plug, by patterning the first conductive film,
   said method further comprising oxidizing to insulate an end portion of the variable resistance layer or a portion of the variable resistance film which is to be the end portion of the variable resistance layer, at least prior to forming the bottom electrode.

2. The method for manufacturing the nonvolatile semiconductor memory element, according to claim 1,
   wherein the oxidizing is oxidizing to insulate the end portion of the variable resistance layer after forming the variable resistance layer.

3. The method for manufacturing the nonvolatile semiconductor memory element, according to claim 1,
   wherein the oxidizing is oxidizing to insulate the portion of the variable resistance film after forming the top electrode and before forming the variable resistance layer.

4. The method for manufacturing the nonvolatile semiconductor memory element, according to claim 3,
   wherein the variable resistance layer includes a tantalum oxide layer, a hafnium oxide layer, or a zirconium oxide layer.

5. The method for manufacturing the nonvolatile semiconductor memory element, according to claim 1, further comprising forming, above the top electrode, an anti-stress layer having a higher compressive stress than the top electrode.

6. The method for manufacturing the nonvolatile semiconductor memory element, according to claim 5,
   wherein the variable resistance layer includes a tantalum oxide layer, a hafnium oxide layer, or a zirconium oxide layer.

7. The method for manufacturing the nonvolatile semiconductor memory element, according to claim 1,
   wherein the variable resistance layer includes a tantalum oxide layer, a hafnium oxide layer, or a zirconium oxide layer.

8. The method for manufacturing the nonvolatile semiconductor memory element, according to claim 2,
   wherein the variable resistance layer includes a tantalum oxide layer, a hafnium oxide layer, or a zirconium oxide layer.

* * * * *